(12) United States Patent
Gu et al.

(10) Patent No.: US 9,223,927 B2
(45) Date of Patent: Dec. 29, 2015

(54) MODELING SYSTEM, METHOD OF MODELING SEMICONDUCTOR DEVICE, COMPUTER-READABLE RECORDING MEDIUM COMPRISING PROGRAM FOR PERFORMING THE METHOD

(71) Applicant: Samsung Electronics Co., Ltd., Suwon-Si, Gyeonggi-Do (KI)

(72) Inventors: Young-Jin Gu, Yongin-si (KR); Jong-Eun Koo, Hwaseong-si (KR); Kyu-Seok Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/486,245

(22) Filed: Sep. 15, 2014

(65) Prior Publication Data
US 2015/0154334 A1    Jun. 4, 2015

(30) Foreign Application Priority Data

Dec. 4, 2013    (KR) .................... 10-2013-0150007

(51) Int. Cl.
*G06F 9/455*    (2006.01)
*G06F 17/50*    (2006.01)

(52) U.S. Cl.
CPC ........ *G06F 17/5081* (2013.01); *G06F 17/5036* (2013.01)

(58) Field of Classification Search
USPC .......... 716/106, 107, 108, 111, 112, 113, 115
See application file for complete search history.

(56) References Cited

U.S. PATENT DOCUMENTS

| | | | |
|---|---|---|---|
| 6,253,359 B1 | 6/2001 | Cano et al. | |
| 6,353,916 B1 * | 3/2002 | Kuwayama | ................... 716/108 |
| 6,507,935 B1 | 1/2003 | Aingaran et al. | |
| 6,536,022 B1 | 3/2003 | Aingaran et al. | |
| 6,907,394 B1 | 6/2005 | Sato | |
| 7,469,391 B2 | 12/2008 | Carrere et al. | |
| 8,230,373 B2 | 7/2012 | Kobayashi et al. | |
| 8,405,453 B2 | 3/2013 | Woods, Jr. et al. | |
| 2009/0113356 A1 * | 4/2009 | Rewienski et al. | ............... 716/2 |

FOREIGN PATENT DOCUMENTS

| | | | |
|---|---|---|---|
| JP | 2001-067388 A | 3/2001 | |
| JP | 3655064 B2 | 6/2005 | |

(Continued)

*Primary Examiner* — Brian Ngo
(74) *Attorney, Agent, or Firm* — Harness, Dickey & Pierce, PLC

(57) ABSTRACT

A modeling system includes a processor. The processor includes a capacitor model generator configured to generate a capacitor model based on a received circuit configuration. The capacitor model generator includes an extract module configured to extract parasitic capacitors from the received circuit configuration and a generate module configured to generate the capacitor model. The generate module generates the capacitor model by classifying the parasitic capacitors into a group of coupled capacitors and a group of grounded capacitors; classifying the coupled capacitors into first coupled capacitors and second coupled capacitors according to a corresponding influence on a performance of the circuit; setting the first coupled capacitors to a maintenance state; and converting at least one of the second coupled capacitors into a grounded capacitor, the at least one of the second coupled capacitors being a second coupled capacitor having a capacitance that is below a desired reference value.

20 Claims, 21 Drawing Sheets

(56) References Cited

FOREIGN PATENT DOCUMENTS

| | | | |
|---|---|---|---|
| JP | 4080464 B2 | 4/2008 |
| JP | 2008-287666 A | 11/2008 |
| JP | 2011-065377 A | 3/2011 |
| JP | 5224642 B2 | 7/2013 |
| KR | 2013-0076029 A | 7/2013 |

* cited by examiner

FIG. 14B
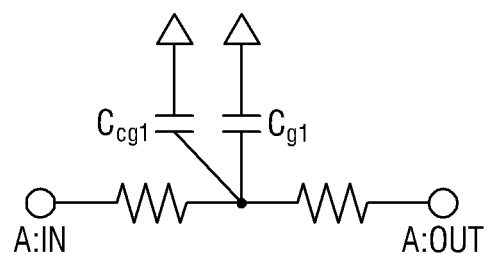
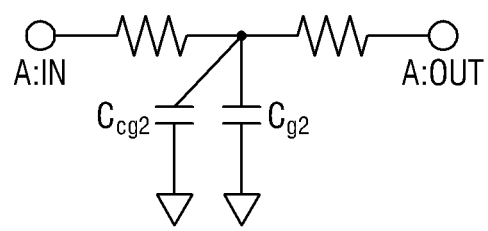

MODELING SYSTEM, METHOD OF MODELING SEMICONDUCTOR DEVICE, COMPUTER-READABLE RECORDING MEDIUM COMPRISING PROGRAM FOR PERFORMING THE METHOD

CROSS-REFERENCE TO RELATED APPLICATIONS

This application claims priority from Korean Patent Application No. 10-2013-0150007 filed on Dec. 4, 2013 in the Korean Intellectual Property Office, the disclosure of which is incorporated herein by reference in its entirety.

BACKGROUND

1. Field of the Invention

The inventive concepts relate to a modeling system, a method of modeling a semiconductor device, and a computer-readable recording medium comprising a program for performing method for modeling semiconductor device.

2. Description of the Related Art

In accordance with developments in the field of high-density integration semiconductor technology, the influence of parasitic capacitors between semiconductor devices and wiring of semiconductor circuits has become an important issue. In a case in which parasitic capacitors are considered to precisely and/or accurately estimate the properties of a parasitic element within a semiconductor circuit, the precision of circuit simulation increases, but the amount of time that it takes to perform circuit simulation may also increase. Therefore, there has steadily grown a desire for a circuit modeling method capable of reducing the amount of time to perform circuit simulation while maintaining a high precision of circuit simulation.

SUMMARY

Aspects of the inventive concepts provide a modeling system that is capable of reducing an amount of time for performing circuit simulation while maintaining a relatively high precision of circuit simulation.

At least one example embodiment relates to a modeling system.

According to an example embodiment, a modeling system includes a processor. The processor includes a capacitor model generator configured to generate a capacitor model based on a received circuit configuration. The capacitor model generator includes an extract module configured to extract parasitic capacitors from the received circuit configuration and a generate module configured to generate the capacitor model. The generate module generates the capacitor model by classifying the parasitic capacitors into a group of coupled capacitors and a group of grounded capacitors; classifying the coupled capacitors into first coupled capacitors and second coupled capacitors according to a corresponding influence on a performance of the circuit; setting the first coupled capacitors to a maintenance state; and converting at least one of the second coupled capacitors into a grounded capacitor, the at least one of the second coupled capacitors being a second coupled capacitor having a capacitance that is below a desired reference value.

Example embodiments provide that, in determining the corresponding influence of on the performance of the circuit, the generate module is configured to convert at least one of the coupled capacitors into a grounded capacitor; and determine an effective capacitance error based on the converting the coupled capacitor into the grounded capacitor.

Example embodiments provide that the modeling system further includes a capacitor model simulation performer configured to receive the generated capacitor model from the capacitor model generator, and simulate the capacitor model.

Example embodiments provide that the generate module includes a first classification sub-model and a second classification sub-module. The first classification sub-model is configured to classify the parasitic capacitors into the group of coupled capacitors and the group of grounded capacitors, and the second classification sub-module is configured to classify the coupled capacitors into the first coupled capacitors and the second coupled capacitors. The generate module includes a first processing sub-module and a second processing sub-module. The first processing sub-module is configured to set the first coupled capacitors to the maintenance state, and the second processing sub-module is configured to convert the at least one of the second coupled capacitors into the grounded capacitor. The first classification sub-module is further configured to provide the classified parasitic capacitors to the second classification sub-module, and the second classification sub-module is further configured to provide the classified coupled capacitors to the first processing sub-module and the second processing sub-module.

Example embodiments provide that the classified parasitic capacitors include first results to be provided to the first processing sub-module and second results to be provided to the second processing sub-module. The first results include information relating to the first coupled capacitors, and the second results include information relating to the second coupled capacitors.

Example embodiments provide that the information relating to the first coupled capacitors includes information relating to channel connected components (CCC) coupled capacitors and information relating to Miller coupled capacitors, the Miller coupled capacitors having a greater effective capacitance error than the CCC coupled capacitors.

Example embodiments provide that the second classification sub-module is configured to classify the coupled capacitors into the first coupled capacitors and the second coupled capacitors based on the classified parasitic capacitors received from the classification sub-module. The second classification sub-module is configured to classify the coupled capacitors into the first coupled capacitors and the second coupled capacitors by dividing the group of coupled capacitors into a plurality of CCC units; classifying, as the CCC coupled capacitors, ones from among the group of coupled capacitors having ends that are connected to two nodes included in a same CCC unit of the plurality of CCC units; classifying, as the Miller coupled capacitors, ones from among the group of coupled capacitors having a first end that is connected to a first CCC unit of the plurality of CCC units and a second end connected to a second CCC unit of the plurality of CCC units; classifying the Miller coupled capacitors as the first coupled capacitors; and classifying the remaining ones of the group of coupled capacitors as the second coupled capacitors. Example embodiments provide that each of the plurality of CCC units includes a group of transistors electrically connected to one another via a channel.

Example embodiments provide that the first processing sub-module is configured to set the first coupled capacitors to the maintenance state based on the classified parasitic capacitors. The setting the first coupled capacitors to the maintenance state includes setting the CCC coupled capacitors to the maintenance state, and setting the Miller coupled capacitors to the maintenance state.

Example embodiments provide that the desired reference value includes at least one of a first reference value based on a desired reference capacitance and a second reference value having a desired reference capacitance ratio. The desired reference capacitance ratio is a ratio of the coupled capacitance to a sum of (i) capacitances of the group of coupled capacitors and (ii) capacitances the group of grounded capacitors.

Example embodiments provide that the second processing sub-module is configured to convert the at least one of the second coupled capacitors into the grounded capacitor based on the classified coupled capacitors. The converting the at least one of the second coupled capacitors into the grounded capacitor includes selecting, from among the second coupled capacitors, a second coupled capacitor having a lower capacitance than the first reference value, and converting the selected second coupled capacitor into the grounded capacitor.

Example embodiments provide that the second processing sub-module is configured to convert the at least one of the second coupled capacitors into the grounded capacitor based on the classified coupled capacitors. The converting the at least one of the second coupled capacitors into the grounded capacitor includes selecting, from among the second coupled capacitors, a second coupled capacitor having a smaller capacitance ratio than the second reference value, and converting the selected second coupled capacitor into the grounded capacitor.

At least one example embodiment relates to a non-transitory computer-readable recording medium including program code for modeling a semiconductor device. When the program code is executed by a processor, the processor is configured to perform functions of modeling a semiconductor device.

According to an example embodiment non-transitory computer-readable recording medium comprising program code for modeling a semiconductor device, the program code, when executed by a processor, the processor is configured to extract parasitic capacitors from a received circuit configuration; classify the extracted parasitic capacitors into a group of coupled capacitors and a group of grounded capacitors; classify the group of coupled capacitors into first coupled capacitors and second coupled capacitors according to a corresponding influence on the performance of a circuit; set the first coupled capacitors to a maintenance state; and convert at least one of the second coupled into a grounded capacitor, the at least one of the second coupled capacitors being a second coupled capacitor having a capacitance that is below a desired reference value.

Example embodiments provide that, in determining the corresponding influence of on the performance of the circuit, the processor is configured to convert at least one of the coupled capacitors into a grounded capacitor; and determine an effective capacitance error based on the converting the coupled capacitor into the grounded capacitor.

Example embodiments provide that the first coupled capacitors include channel connected components (CCC) coupled capacitors and Miller coupled capacitors.

Example embodiments provide that, in classifying the group of coupled capacitors into the first coupled capacitors and the second coupled capacitors, the processor is configured to divide the group of coupled capacitors into a plurality of CCC units; classify, as the CCC coupled capacitors, ones from among the group of coupled capacitors having ends connected to two nodes included in same CCC unit; classifying, as the Miller coupled capacitors, ones from among the group of coupled capacitors having a first end that is connected to a first CCC unit of the plurality of CCC units and a second end connected to a second CCC unit of the plurality of CCC units; classify the Miller coupled capacitors as the first coupled capacitors; classify the remaining ones of the group of coupled capacitors as the second coupled capacitors; and classify the rest of the coupled capacitors as the second coupled capacitors, and each of the plurality of CCC units includes a group of transistors electrically connected to one another via a channel.

Example embodiments provide that, in setting the first coupled capacitors to the maintenance state, the processor is configured to set the CCC coupled capacitors to the maintenance state, and setting the Miller coupled capacitors to the maintenance state.

Example embodiments provide that the desired reference value includes a first reference value having a desired reference capacitance or a second reference having a desired reference capacitance ratio; and the desired reference capacitance ratio includes a ratio of coupled capacitance to a sum of capacitances of the group of coupled capacitors and the group of grounded capacitors.

At least one example embodiment relates to a modeling system for generating a capacitor model.

an example embodiment a modeling system for generating a capacitor model includes a processor configured to receive a circuit configuration; extract parasitic capacitors from the received circuit configuration; classify the parasitic capacitors into a group of coupled capacitors and a group of grounded capacitors; classify the coupled capacitors into first coupled capacitors and second coupled capacitors according to a corresponding influence on a performance of the circuit; set the first coupled capacitors to a maintenance state; convert at least one of the second coupled capacitors into a grounded capacitor, the at least one of the second coupled capacitors being a second coupled capacitor having a capacitance that is below a desired reference value; and generate the capacitor model based on the first coupled capacitors and the converted second coupled capacitor.

Example embodiments provide that in determining the corresponding influence of on the performance of the circuit, the processor is further configured to convert at least one of the coupled capacitors into a grounded capacitor; and determine an effective capacitance error based on the converting the coupled capacitor into the grounded capacitor.

Example embodiments provide that the processor is further configured to simulate the generated capacitor model, the simulating including one of generating a graphic representation generated of the capacitor model and generating an animation of the capacitor model.

Other features and aspects may be apparent from the following detailed description, the drawings, and the claims.

BRIEF DESCRIPTION OF THE DRAWINGS

The above and other aspects and features of the inventive concepts will become more apparent by describing in detail exemplary embodiments thereof with reference to the attached drawings, in which:

FIGS. 14a and 14b are circuit diagrams for explaining the flowchart illustrated in FIG. 13 according to an example embodiment.

DETAILED DESCRIPTION OF THE EMBODIMENTS

Figure 1:
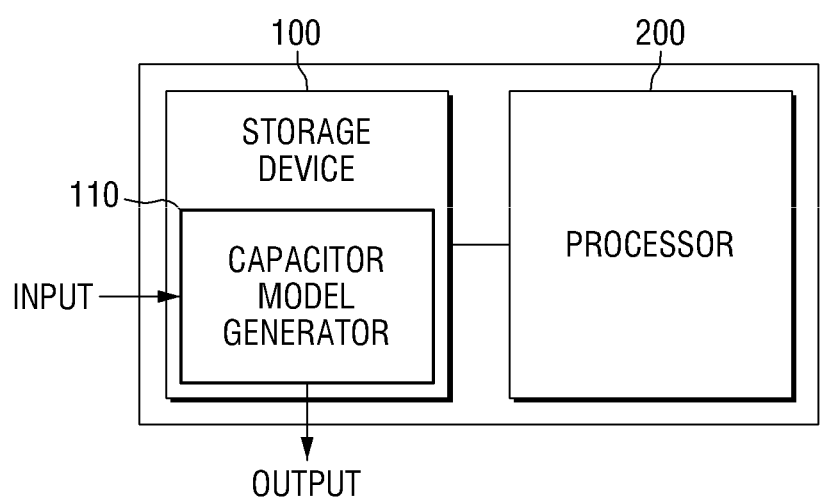
FIG. 1 is a diagram illustrating a modeling system according to an example embodiment.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, referring to FIGS. 1 to 3, a modeling system according to an example embodiment of the present inventive concept will be described.

Figure 2:
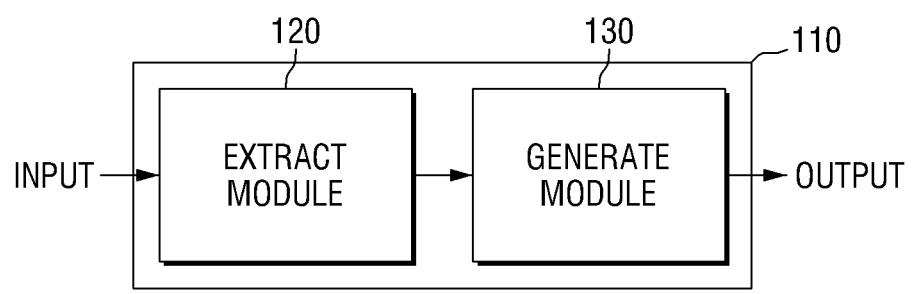
FIG. 2 is a diagram illustrating a capacitor model generator illustrated in FIG. 1 according to an example embodiment.
Figure 3:
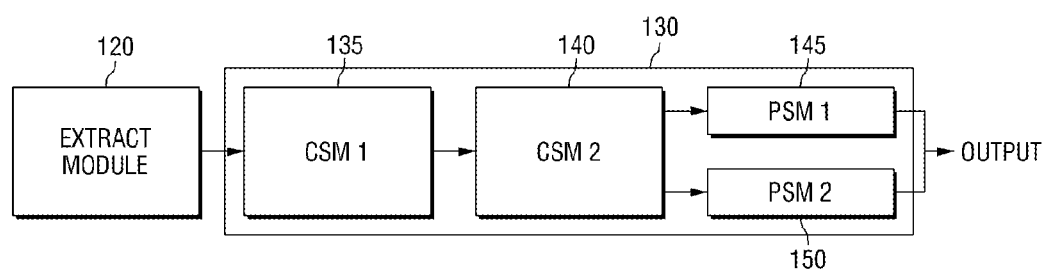
FIG. 3 is a diagram illustrating a generate module illustrated in FIG. 2 according to an example embodiment.

FIG. 1 is a diagram illustrating a modeling system according to an embodiment, FIG. 2 is a diagram illustrating a capacitor model generator illustrated in FIG. 1, and FIG. 3 is a diagram illustrating a generate module illustrated in FIG. 2.

Referring to FIG. 1, a modeling system 1 may include a storage device 100 and a processor 200.

Storage device 100 may be a computer readable storage medium that generally includes a random access memory (RAM), read only memory (ROM), a permanent mass storage device (such as a disk drive), and/or any other like data storage mechanism capable of storing and recording data. Storage device 100 may be configured to store program code for one or more operating systems and program code for one or more software components and/or modules, such as the capacitor model generator 110. These software components may also be loaded from a separate computer readable storage medium into storage device 200 using a drive mechanism (not shown). Such separate computer readable storage medium may include a floppy drive, disc, tape, DVD/CD-ROM drive, memory card, and/or other like computer readable storage medium (not shown). In some embodiments, software components may be loaded into storage device 100 from a remote data storage device via a network interface, rather than via a computer readable storage medium.

Processor 200 may be a special purpose computer processing device configured to carry out program code stored in the storage device 100 by performing arithmetical, logical, and input/output operations. For example, the capacitor model generator 110 may be loaded into the processor 200. Once the capacitor model generator 110 is loaded into the processor 200, the processor 200 may be configured to generate a capacitor model according to various example embodiments.

Referring to FIG. 2, the capacitor model generator 110 may include an extract module 120 and a generate module 130. In an example embodiment, the capacitor model generator 110 may be implemented as program code and may then be stored in the storage device 100.

More specifically, the extract module 120 may receive an input "INPUT" from a source that is external to the extract module 120. In an example embodiment, the input "INPUT" may include, but is not limited to, a circuit configuration and/or a circuit equation representing a circuit configuration. The input "INPUT" may be also stored in the storage device 100, and the extract module 120 may receive the input "INPUT" from the storage device 100.

The extract module 120 may receive the input "INPUT", and may extract parasitic capacitors based on the input "INPUT". The extract module 120 may provide the extracted parasitic capacitors to the generate module 130.

Referring to FIG. 3, the generate module 130 may include a first classification sub-module CSM1, a second classification sub-module CSM2, a first processing sub-module PSM1, and a second processing sub-module PSM2.

The first classification sub-module CSM1 may receive the extracted parasitic capacitors from the extract module 120, and may perform a first operation of classifying the extracted parasitic capacitors into a group of coupled capacitors and a group of grounded capacitors. The first classification sub-module CSM1 may provide the results of the first operation to the second classification sub-module CSM2. The results of the first operation may include information associated with the coupled capacitors and the grounded capacitors.

The second classification sub-module CSM2 may receive the results of the first operation from the first classification sub-module CSM1, and may perform a second operation of classifying the group of coupled capacitors into first coupled capacitors and second coupled capacitors based on the results of the first operation according to their influence on the performance of a circuit.

In various embodiments, the second classification sub-module CSM2 may classify the group of coupled capacitors as first coupled capacitors and second coupled capacitors. The second classification sub-module CSM2 may further classify the first coupled capacitors into channel connected components (CCC) coupled capacitors and/or Miller coupled capacitors.

CCC coupled capacitors may include any coupled circuit elements that transfer energy within an electrical network by means of capacitance between the circuit elements. The Miller coupled capacitors may include circuit elements that, when coupled, increase an equivalent input capacitance due to amplification a capacitance between input and output elements.

In various example embodiments, the Miller coupled capacitors may have a greater influence than the CCC coupled capacitors on the performance of a circuit, and the CCC coupled capacitors may have a greater influence than the second coupled capacitors on the performance of a circuit. The CCC coupled capacitors and the Miller coupled capacitors will be described later in further detail.

The influence of a coupled capacitor on the performance of a circuit may be determined by effective capacitance error that may be generated during the conversion of the coupled capacitor into a grounded capacitor. Effective capacitance error may be defined as, but is not limited to, the difference between effective capacitance of an input terminal and effective capacitance of an output terminal of an amplification circuit with a voltage gain.

In an example embodiment, in a case in which a Miller coupled capacitor is converted into a grounded capacitor, the effective capacitance error may increase proportionally to the voltage gain, which may become more apparent by the Example below.

<Example 1>

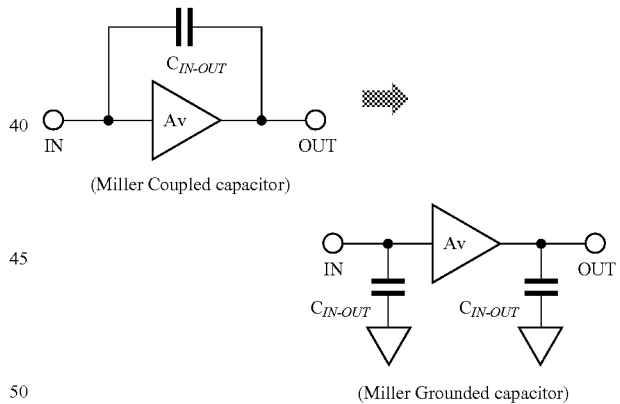

(Miller Coupled capacitor)

(Miller Grounded capacitor)

As shown in the Example 1 above, in a case in which a Miller coupled capacitor is converted into a Miller grounded capacitor, the effective capacitance at the input terminal of the Miller grounded capacitor and the effective capacitance at the output terminal of the Miller grounded capacitor are as follows:

Effective Capacitance at Input Terminal: $(1-A_v) \times C_{IN-OUT}$

Effective Capacitance at Output Terminal:

$$\frac{C_{IN-OUT}}{1-A_v}$$

where $A_v$ indicates the voltage gain of an amplification circuit. Since the voltage gain $A_v$ is a negative real number and a magnitude of the voltage gain $A_v$ is greater than 1 (i.e., $|A_v|\gg1$), the effective capacitance at the input terminal may be proportional to the voltage gain $A_v$, and the effective capacitance at the output terminal may be inversely proportional to the voltage gain $A_v$.

Therefore, as mentioned above, because the effective capacitance of the input terminal is proportional to the voltage gain $A_v$ and the effective capacitance of the output terminal is inversely proportional to the voltage gain $A_v$, the effective capacitance error of the Miller capacitor (i.e., the difference between the effective capacitance at the input terminal and the effective capacitance at the output terminal) may increase proportionally to the voltage gain. Other coupled capacitors, other than Miller coupled capacitors, may have different effective capacitance errors from Miller coupled capacitors when converted into grounded capacitors, which will be described later in detail.

The second classification sub-module CSM2 may perform a second operation and may provide the results of the second operation to the first processing sub-module PSM1 and the second processing sub-module PSM2.

The results of the second operation may include first results to be provided to the first processing sub-module PSM1 and second results to be provided to the second processing sub-module PSM2. The first results may include information relating to the first coupled capacitors, and the second results may include information relating to the second coupled capacitors.

The information relating to first coupled capacitors may include information relating to the CCC coupled capacitors and the Miller coupled capacitors, which have a greater effective capacitance error than the CCC coupled capacitors.

In various embodiments, the first processing sub-module PSM1 may receive the first results from the second classification sub-module CSM2, and may perform a third operation of setting the first coupled capacitors to a maintenance state where the first coupled capacitors can be maintained without being converted into grounded capacitors.

In various example embodiments, the third operation may include setting the CCC coupled capacitors to the maintenance state and then setting the Miller coupled capacitors to the maintenance state. Alternatively, the third operation may include setting the Miller coupled capacitors to the maintenance state and then setting the CCC coupled capacitors to the maintenance state.

In various embodiments, the second processing sub-module PSM2 may receive the second results from the second classification sub-module CSM2, and may perform a fourth operation of converting second coupled capacitors that fail to meet a desired (or alternatively "predefined") reference into grounded capacitors.

According to an example embodiment, the desired reference may include a first reference having a reference capacitance and/or a second reference having a reference capacitance ratio.

The term "desired reference capacitance ratio", as used herein, may indicate a ratio of coupled capacitance to a sum of capacitances of the group of coupled capacitors and the group of grounded capacitors.

The fourth operation may include at least one of: selecting second coupled capacitors that have a lower capacitance than the first reference, and thus, fail to meet the first reference, and converting the selected second coupled capacitors into grounded capacitors; and selecting second coupled capacitors that have a lower capacitance ratio than a reference capacitance ratio, and thus, fails to meet the second reference, and converting the selected second coupled capacitors into grounded capacitors.

The generate module 130 may generate a capacitor model by performing the first through fourth operations, and the generated capacitor model may become an output "OUTPUT" of the generate module 130.

The capacitor model generator 110 may perform the aforementioned operations of the extract module 120 and the generate module 130 via the processor 200.

The modeling system 1 may (i) classify coupled capacitors according to their corresponding influence on the properties of a circuit; (ii) may maintain Miller coupled capacitors and CCC coupled capacitors, which have a great influence on the properties of a circuit, as coupled capacitors; and (iii) may convert coupled capacitors that are neither Miller coupled capacitors nor CCC coupled capacitors and fail to meet a desired and/or predefined reference into grounded capacitors, thereby reducing an amount of time used to perform circuit simulation while maintaining a high precision and/or accuracy of circuit simulation.

A modeling system according to another embodiment will hereinafter be described with reference to FIGS. 4 to 6.

Figure 4:
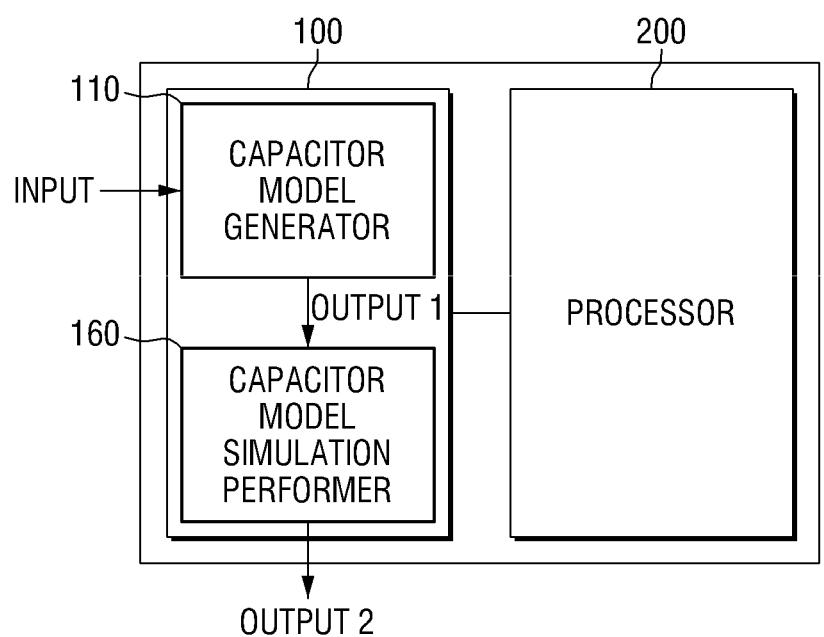
FIG. 4 is a diagram illustrating a modeling system according to an example embodiment.
Figure 5:
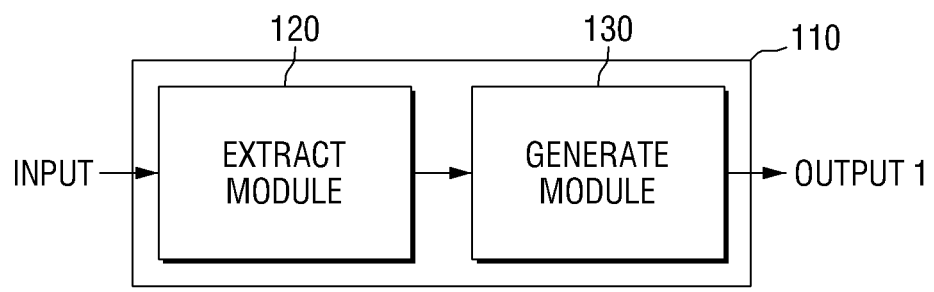
FIG. 5 is a diagram illustrating a capacitor model generator illustrated in FIG. 4 according to an example embodiment.
Figure 6:
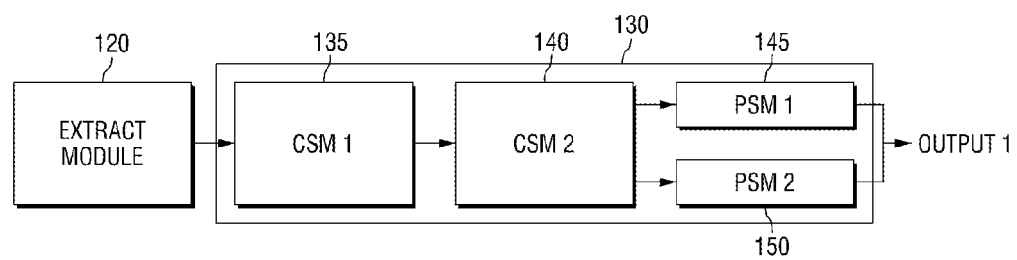
FIG. 6 is a diagram illustrating a generate module illustrated in FIG. 5 according to an example embodiment.

FIG. 4 is a diagram illustrating a modeling system according to another embodiment, FIG. 5 is a diagram illustrating a capacitor model generator illustrated in FIG. 4, and FIG. 6 is a diagram illustrating a generate module illustrated in FIG. 5.

A modeling system 2 according to an example embodiment will hereinafter be described, focusing mainly on differences with the modeling system 1 of FIG. 1.

Referring to FIG. 4, a modeling system 2 may include a storage device 100 and a processor 200 according to an example embodiment.

According to various embodiments, the storage device 100 and the processor 200 may be the same or similar to the storage device 100 and the processor 200 discussed above with respect to FIGS. 1-3.

The capacitor model simulation performer 160 may receive a first output OUTPUT1 from the capacitor model generator 110, and may simulate the first output OUTPUT1. The first output OUTPUT1 may include a capacitor model generated by the capacitor model generator 110. The capacitor model simulation performer 160 may be implemented as program code, and may then be stored in the storage device 100.

The capacitor model simulation performer 160 may generate a second output OUTPUT2 by simulating a capacitor model provided by the capacitor model generator 110. The second output OUTPUT2 may include capacitor model simulation results.

Referring to FIGS. 5 and 6, the capacitor model generator 110 may include an extract module 120 and a generate module 130. The extract module 120 and the generate module 130 are the same as their respective counterparts of FIG. 2, and thus, their detailed descriptions will be omitted.

Unlike the capacitor model generator 110 of FIG. 2, the capacitor model generator 110 of FIG. 5 provides a generated capacitor model (i.e., the first output OUTPUT1), to the capacitor model simulation performer 160. The generated capacitor model may be a graphic representation, an animated simulation, and/or any other like representation of the first output OUTPUT1. The operation and structure of the capacitor model generator 110 of FIG. 5 may be the same or similar as the operation and structure of the capacitor model generator 110 of FIG. 2. Additionally, the operation and structure of components shown in FIG. 6 (i.e., the first classification sub-module CSM1, the second classification sub-module CSM2, the first processing sub-module PSM1, and the second processing sub-module PSM2) may be the same or similar to the components as discussed above with respect to FIG. 3.

A method of modeling a semiconductor device of modeling system 1 of FIG. 1 will hereinafter be described with reference to FIGS. 7 to 14b.

Figure 7:
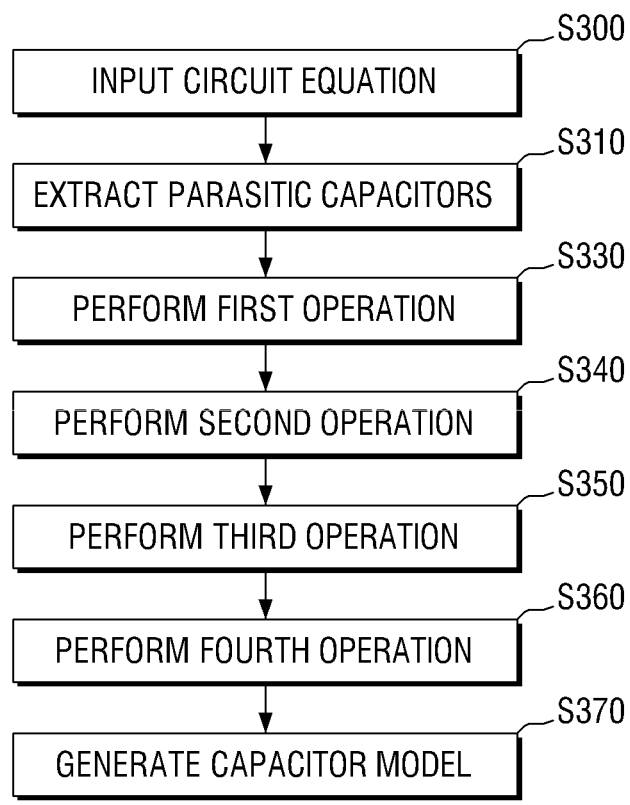
FIG. 7 is a flowchart illustrating a semiconductor device modeling method of the modeling system illustrated in FIG. 1 according to an example embodiment.

FIG. 7 is a flowchart illustrating a semiconductor device modeling method of the modeling system illustrated in FIG. 1 according to an example embodiment. The semiconductor device modeling method of FIG. 7 may be performed by the modeling system 1 depicted by FIGS. 1-3. In some embodiments, the semiconductor device modeling method of FIG. 7 may be performed by any physical computing device that has the same or similar components as modeling system 1 as discussed above with respect to FIG. 1-3.

Referring to FIG. 7, as shown in operation S300, the modeling system 1 receives a circuit equation.

In various embodiments, the capacitor model generator 110 of the storage device 100 may be provided with a circuit equation as an input "INPUT". The circuit equation may be provided by an external source, or may be stored in the storage device 100. The external source may include, but is not limited to, a user device or a client device where the circuit equation is generated and/or stored.

As shown in operation S310, the modeling system 1 extracts parasitic capacitors.

In various embodiments, the capacitor model generator 110 may extract parasitic capacitors based on the circuit equation provided by the capacitor model generator 110. The extraction of parasitic capacitors may be performed by the extract module 120. The extracted parasitic capacitors may include a group of coupled capacitors (e.g., first through seventh capacitors C1 through C7 illustrated in FIG. 9a) and/or a group of grounded capacitors.

As shown in operation S330, the modeling system 1 performs a first operation.

In various embodiments, the first operation may include classifying the extracted parasitic capacitors into a group of coupled capacitors (for example, the capacitors C1 through C7) and a group of grounded capacitors. The first operation may be performed by the first classification sub-module CSM1, and the first classification sub-module CSM1 may provide the results of the first operation to the second classification sub-module CSM2.

As shown in operation S340, the modeling system 1 performs a second operation.

In various embodiments, the second operation may include classifying the group of coupled capacitors into first coupled capacitors and second coupled capacitors according to their influence on the performance of a circuit. The second operation will hereinafter be described in further detail with reference to FIGS. 8, 9a and 9b.

As shown in operation S350, the modeling system 1 performs a third operation.

In various embodiments, the third operation may include setting the first coupled capacitors to a maintenance state.

As shown in operation S360, the modeling system 1 performs a fourth operation.

In various embodiments, the fourth operation may include converting second coupled capacitors that fail to meet a desired and/or predefined reference into grounded capacitors. The desired and/or predefined reference may include a first reference (i.e., a predefined reference capacitance) or a second reference (i.e., a predefined reference capacitance ratio).

As shown in operation S370, the modeling system 1 generates a capacitor model in response to the completion of the third operation and the fourth operation (as discussed above with respect to operations S350 and S360).

In various embodiments, the generate module 130 may generate a capacitor model by performing the first through fourth operations, and the generated capacitor model may become an output "OUTPUT" of the generate module 130. The generated capacitor model may be a mathematical, graphical, and/or any other like representation of the first through fourth operations.

Figure 8:
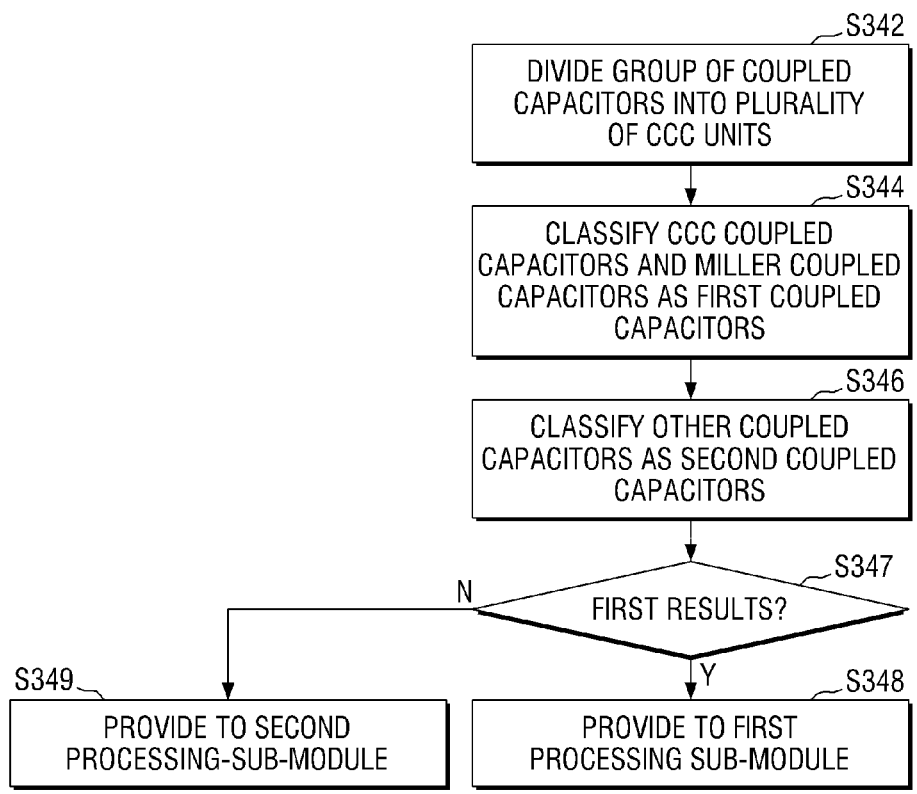
FIG. 8 is a flowchart illustrating a step for performing a second operation illustrated in FIG. 7 according to an example embodiment.

FIG. 8 is a flowchart illustrating a step for performing a second operation illustrated in FIG. 7 according to an example embodiment.

As shown in operation S342, the modeling system 1 divides the coupled capacitors into a plurality of CCC units.

As shown in operation S344, the modeling system 1 classifies CCC coupled capacitors and Miller coupled capacitors, from among coupled capacitors, in response to the division of the coupled capacitors into a plurality of CCC units being complete.

Figure 9A:
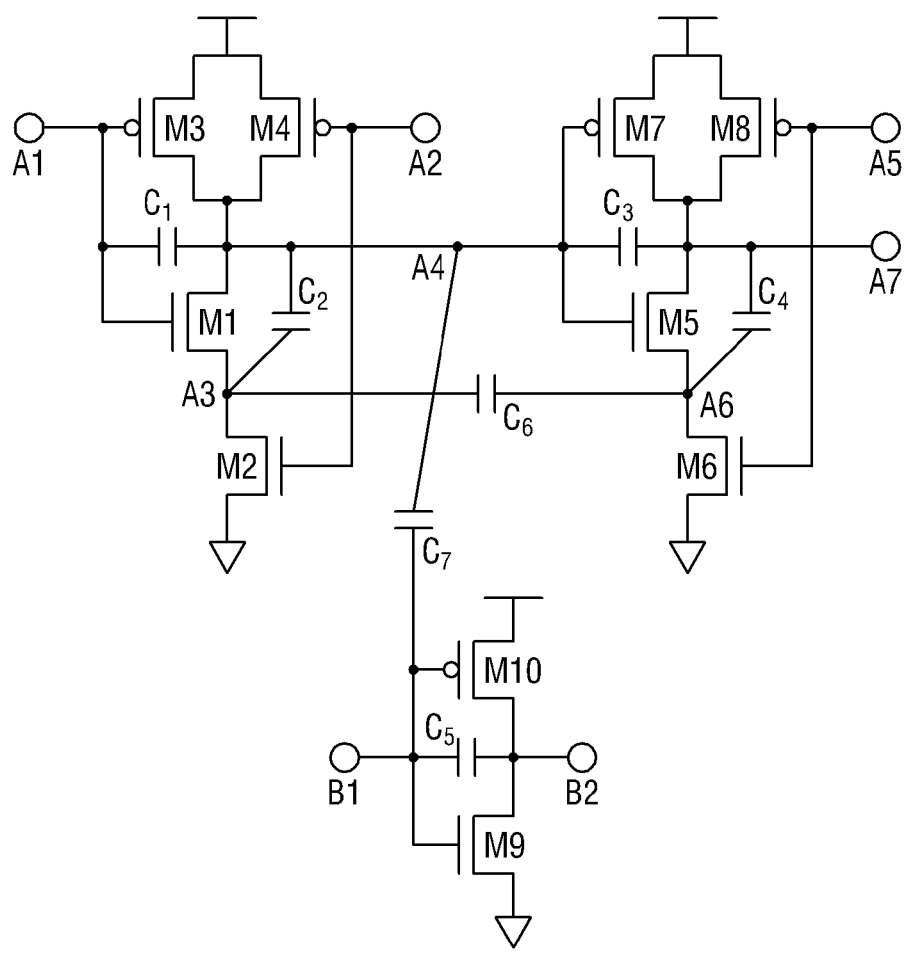
FIGS. 9a to 9e are circuit diagrams for explaining the flowchart illustrated in FIG. 8 according to an example embodiment.
Figure 9B:
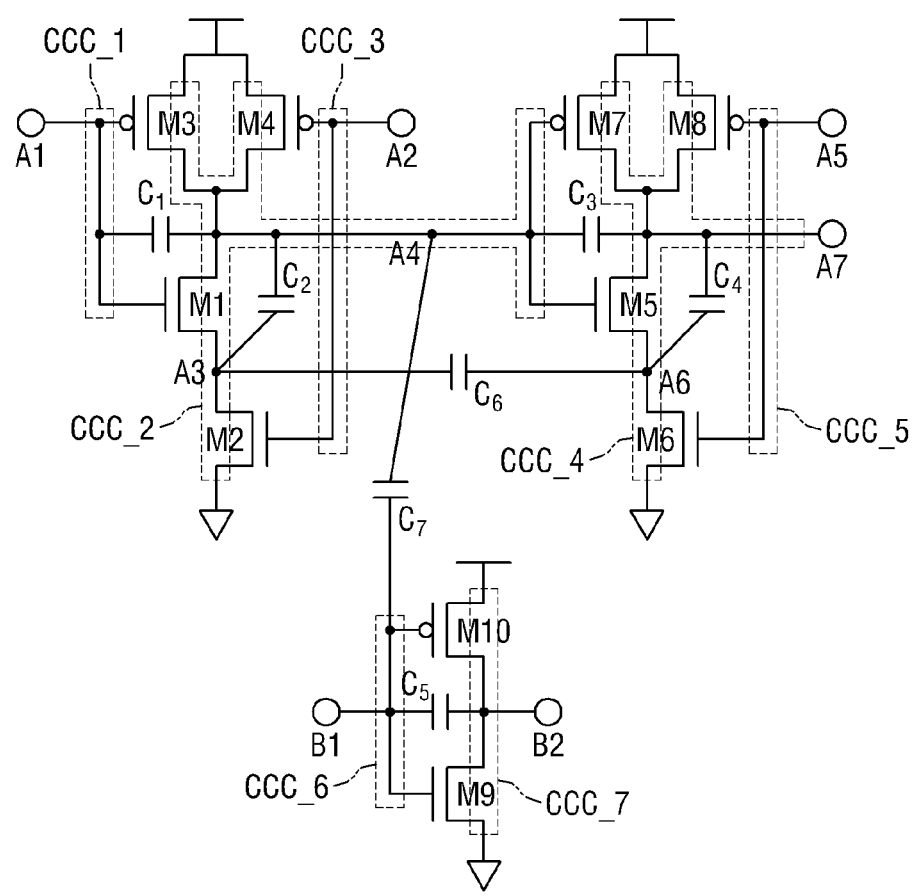
Figure 9C:
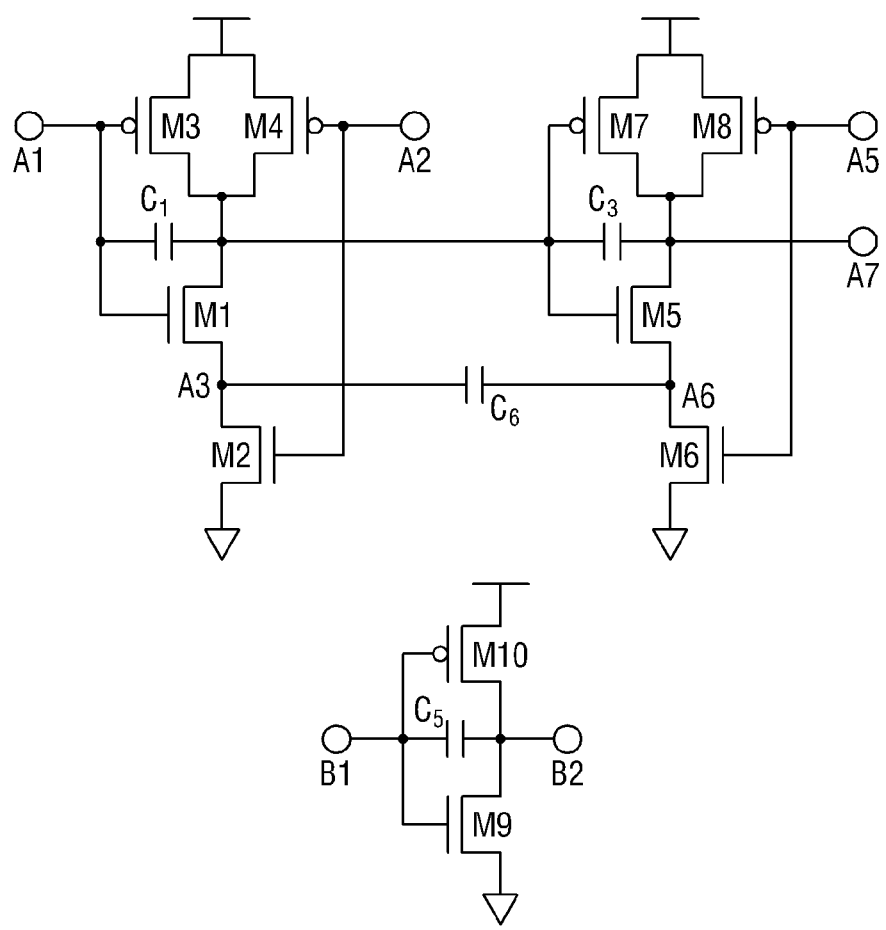

For example, from among the first through seventh capacitors C1 through C7 as shown in FIG. 9a, only the Miller coupled capacitors, (i.e., the first, third, fifth, and sixth capacitors C1, C3, C5, and C6, are depicted in FIG. 9c).

In various embodiments, the coupled capacitors having both ends which each of the both ends is connected to first CCC unit comprising input terminal of a transistor and second CCC unit comprising output terminal of the transistor may be classified as a Miller coupled capacitor. Accordingly, each of the following are classified as Miller coupled capacitors: the first capacitor C1, which is a coupled capacitor having each of its ends connected to the gate of a first transistor M1 that are included in the first CCC unit CCC_1, and the drain of a first transistor M1 that are included in the second CCC unit CCC_2, respectively; the third capacitor C3, which is a coupled capacitor having ends each of that are connected to the gate of a fifth transistor M5 that are included in the second CCC unit CCC_2, and the drain of a fifth transistor M5 that are included in the fourth CCC unit CCC_4; the fifth capacitor C5, which is a coupled capacitor having ends that are connected to the gate of a ninth transistor M9 that are included in the sixth CCC unit CCC_6 and the drain of a ninth transistor M9 that are included in the seventh CCC unit CCC_7; and the sixth capacitor C6, which is a coupled capacitor having both ends which each of the both ends is connected to the gate of a fifth transistor M5 that are included in the second CCC unit CCC_2 and the source of a fifth transistor M5 that are included in the fourth CCC unit CCC_4.

Figure 9D:
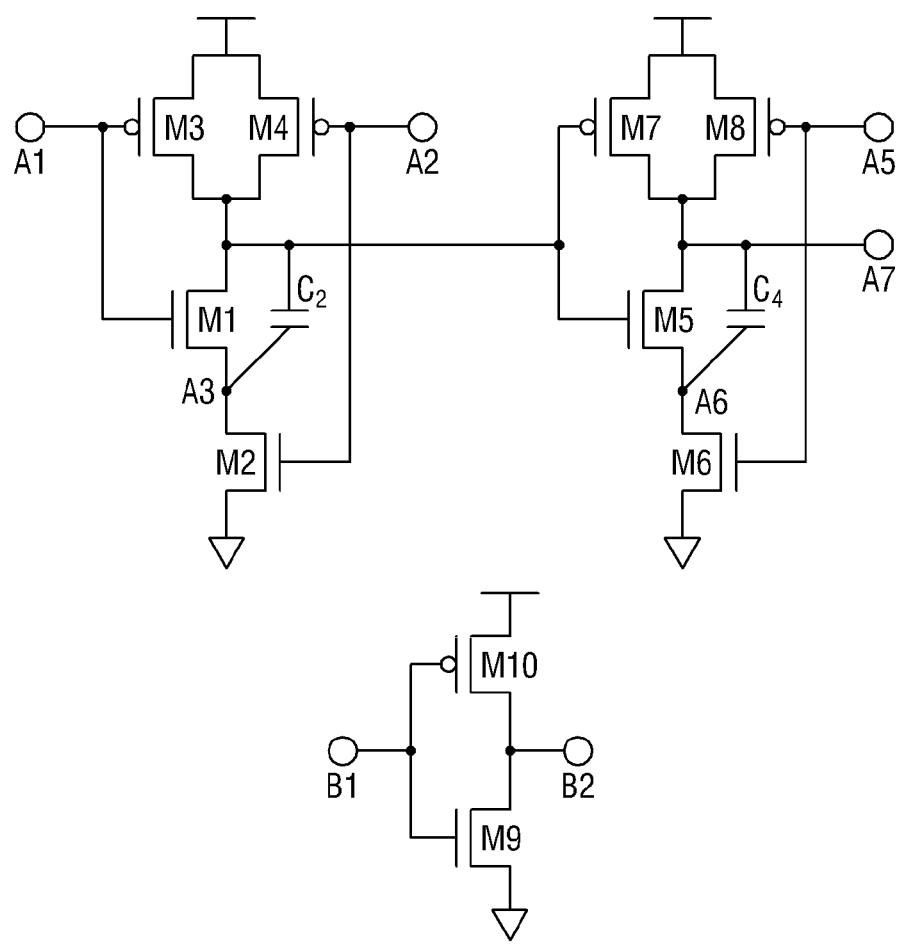

Among the first through seventh capacitors C1 through C7, only the CCC coupled capacitors (i.e., the second and fourth capacitors C2 and C4), are depicted in FIG. 9d.

In various embodiments, coupled capacitors having both ends connected to two nodes included in same CCC unit among the plurality of CCC units may be classified as a CCC coupled capacitor. Accordingly, the second capacitor C2, which is coupled capacitors having both ends connected to two nodes included in second CCC unit CCC_2, and the fourth capacitor C4, which is coupled capacitors having both ends connected to two nodes included in fourth CCC unit CCC_4, may be classified as CCC coupled capacitors.

Referring back to FIG. 8, as shown in operation S346, the modeling system 1 classifies the coupled capacitors as second coupled capacitors, except for the first coupled capacitors.

Figure 9E:
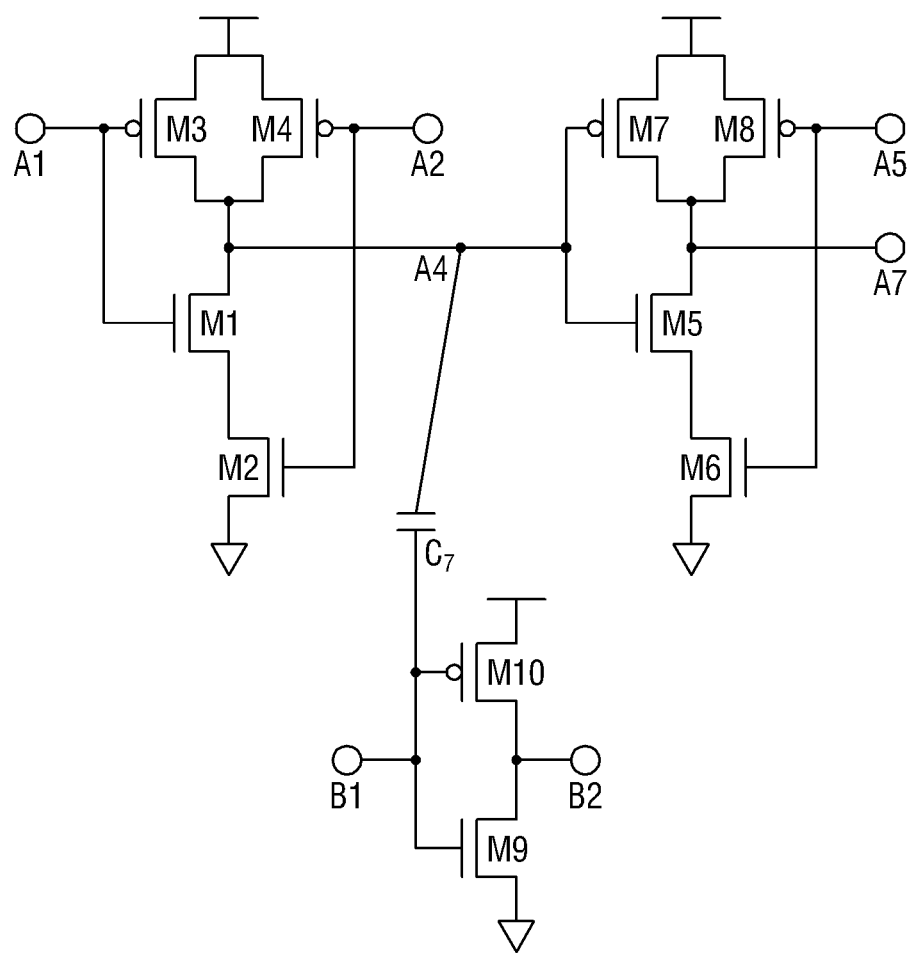

Among the first through seventh capacitors C1 through C7, only the second coupled capacitor (i.e., the seventh capacitor C7, which is depicted in FIG. 9e) are classified as second coupled capacitors. More specifically, the seventh capacitor C7, which is connected between two CCC units having no input/output relationship therebetween (i.e., the second and sixth CCC units CCC_2 and CCC_6, is neither a Miller coupled capacitor nor a CCC coupled capacitor), may be classified as a second coupled capacitor.

The results of the second operation may include first results to be provided to the first processing sub-module PSM1 and second results to be provided to the second processing sub-module PSM2. The first results may include information associated with the first coupled capacitors, and the second results may include information associated with the second coupled capacitors.

As shown in operation S347, the modeling system 1 determines if the first results are returned as the results of the second operation. If the modeling system 1 determines that the first results are returned as the results of the second operation, the modeling system 1 proceeds to operation S348 to provide the first results to the first processing sub-module PSM1. If the modeling system 1 determines that the first results are not returned as the results of the second operation, the modeling system 1 proceeds to operation S348 to provide the second results to the second processing sub-module PSM2 in response to the second results being returned as the results of the second operation.

Once the modeling system 1 provides the first results to the first processing sub-module PSM1 and/or provides the second results to the second processing sub-module PSM2, the modeling system 1 proceeds to operation S350 to perform the third operation as discussed above with respect to FIG. 7.

FIGS. 9a to 9e are circuit diagrams for explaining the flowchart illustrated in FIG. 8 according to an example embodiment.

Referring to FIGS. 9a and 9b, a circuit including the first through seventh capacitors C1 through C7 may be divided into a plurality of CCC units (i.e., CCC_1 through CCC_7).

FIGS. 9a and 9b illustrate the circuit including the first through seventh capacitors C1 through C7 before and after they are divided into the CCC units CCC_1 through CCC_7. Each of the CCC units CCC_1 through CCC_7 may include a group of transistors electrically connected to one another via a channel. Referring to FIG. 9a, the circuit including the first through seventh capacitors C1 through C7 only has the group of coupled capacitors, among parasitic capacitors extracted based on a circuit equation and/or circuit configuration.

A total of seven CCC units CCC_1 through CCC_7 are depicted in FIG. 9b. However, the numbers of coupled capacitors, transistors and CCC units included in a circuit are not limited to those set forth in FIGS. 9a and 9b. A CCC unit may include, but is not limited to, a group of transistors connected to each other via a channel (like the fourth and seventh CCC units CCC_4 and CCC_7), the gates of transistors connected to each other via a channel (like the first, fifth, and sixth CCC units CCC_1, CCC_5, and CCC_6), or a combination thereof (like the second CCC unit CCC_2).

Figure 10:
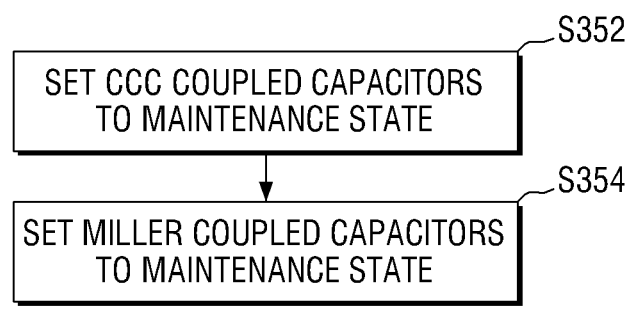
FIG. 10 is a flowchart illustrating an example of performing a third operation illustrated in FIG. 7 according to an example embodiment.

FIG. 10 is a flowchart illustrating an example of performing a third operation illustrated in FIG. 7 according to an example embodiment.

As shown in operation S352, the modeling system 1 sets the CCC coupled capacitors to a maintenance state. In various embodiments, the CCC coupled capacitors found from the second operation may be set to the maintenance state.

As shown in operation S354, the modeling system 1 sets the Miller coupled capacitors to the maintenance state in response to the setting of the CCC coupled capacitors to the maintenance state being complete. In various embodiments, the Miller coupled capacitors found from the second operation may be set to the maintenance state.

In various embodiments operation S352 may be performed after operation S354. For example, the CCC coupled capacitors may be searched for first and set to the maintenance state, and then Miller coupled capacitors may be searched for and set to the maintenance state in consideration that a group of coupled capacitors can be divided into a plurality of CCC units.

Once the modeling system 1 sets the Miller coupled capacitors to the maintenance state and sets the CCC coupled capacitors to the maintenance state, the modeling system 1 proceeds to operation S360, to perform the fourth operation as discussed above with respect to FIG. 7.

In various embodiments, the fourth operation may include converting second coupled capacitors that fail to meet a desired and/or predefined reference into grounded capacitors. The desired and/or predefined reference may include a first reference (i.e., a desired and/or predefined reference capacitance) or a second reference (i.e., a desired and/or predefined reference capacitance ratio).

Figure 11:
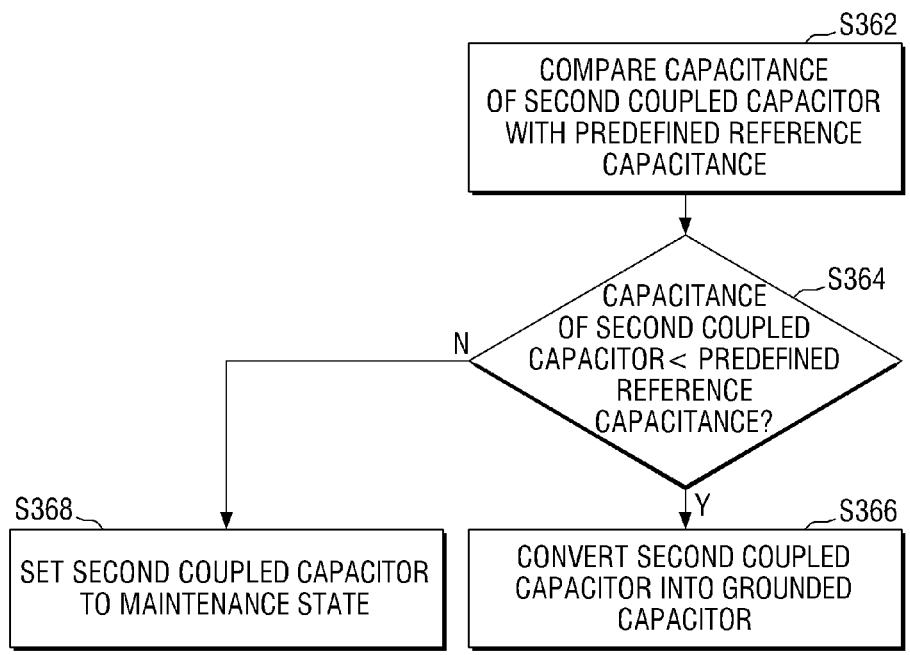
FIG. 11 is a flowchart illustrating an embodiment of step for performing a fourth operation illustrated in FIG. 7 according to an example embodiment.

FIG. 11 is a flowchart illustrating an example of performing the fourth operation illustrated in FIG. 7 according to an example embodiment.

As shown in operation S362, the modeling system 1 compares the capacitance of a second coupled capacitor with a desired and/or predefined reference capacitance.

As shown in operation S364, the modeling system 1 determines if the capacitance of the second coupled capacitor is less than the desired and/or predefined reference capacitance. If the modeling system 1 determines that the capacitance of the second coupled capacitor is less than the desired and/or predefined reference capacitance, the modeling system 1 proceeds to operation S366 to convert the second coupled capacitor into a grounded capacitor.

If the modeling system 1 determines that the capacitance of the second coupled capacitor is not less than the desired and/or predefined reference capacitance, the modeling system 1 proceeds to operation S368 to set the second coupled capacitor to the maintenance state.

Figure 12A:
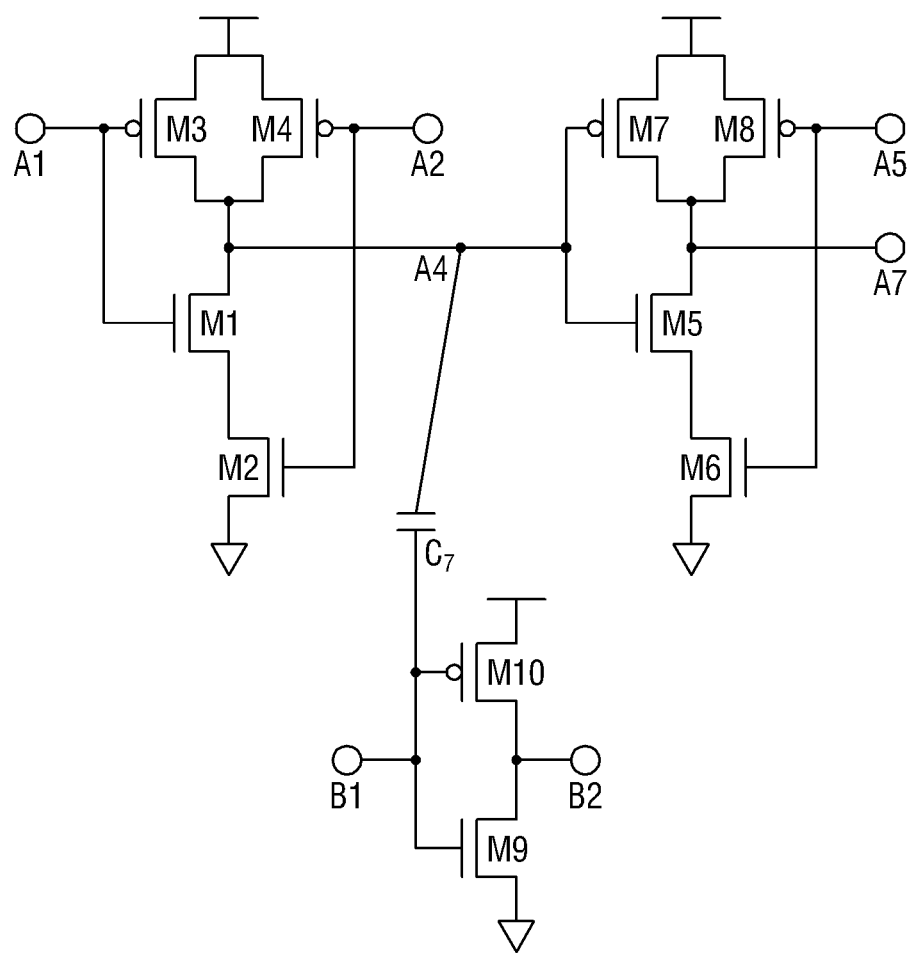
FIGS. 12a and 12b are circuit diagrams for explaining the flowchart illustrated in FIG. 11 according to an example embodiment.
Figure 12B:
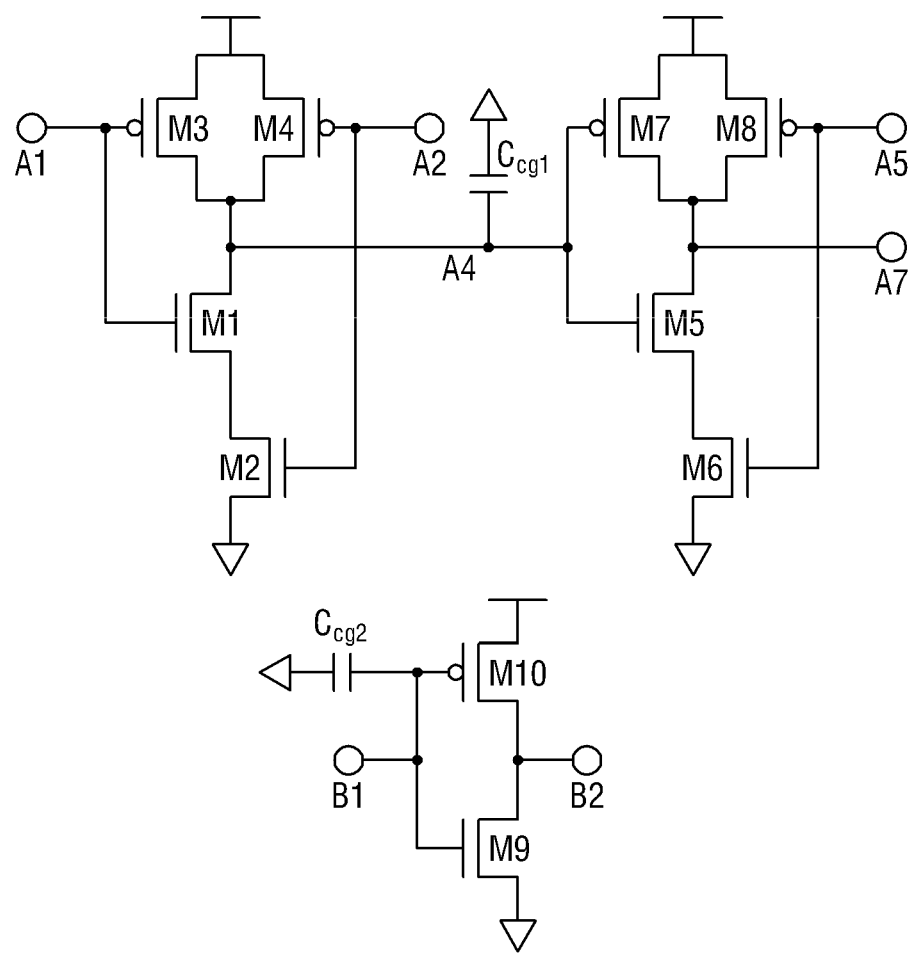

FIGS. 12a and 12b are circuit diagrams for explaining the flowchart illustrated in FIG. 11 according to an example embodiment.

As illustrated in FIGS. 12a and 12b, in response to the second coupled capacitor, for example, the seventh capacitor C7, having a lower capacitance than the reference capacitance, the seventh capacitor C7 is converted into grounded capacitors $C_{cg1}$ and $C_{cg2}$. FIGS. 12a and 12b illustrate the circuit including the seventh capacitor C7 before and after the conversion of the seventh capacitor C7 into the grounded capacitors $C_{cg1}$ and $C_{cg2}$.

A circuit including one second coupled capacitor (i.e., the seventh capacitor C7), is depicted in FIG. 12a, but the second coupled capacitor should be construed as being part of larger circuitry, rather than as limiting the inventive concepts thereto.

Figure 13:
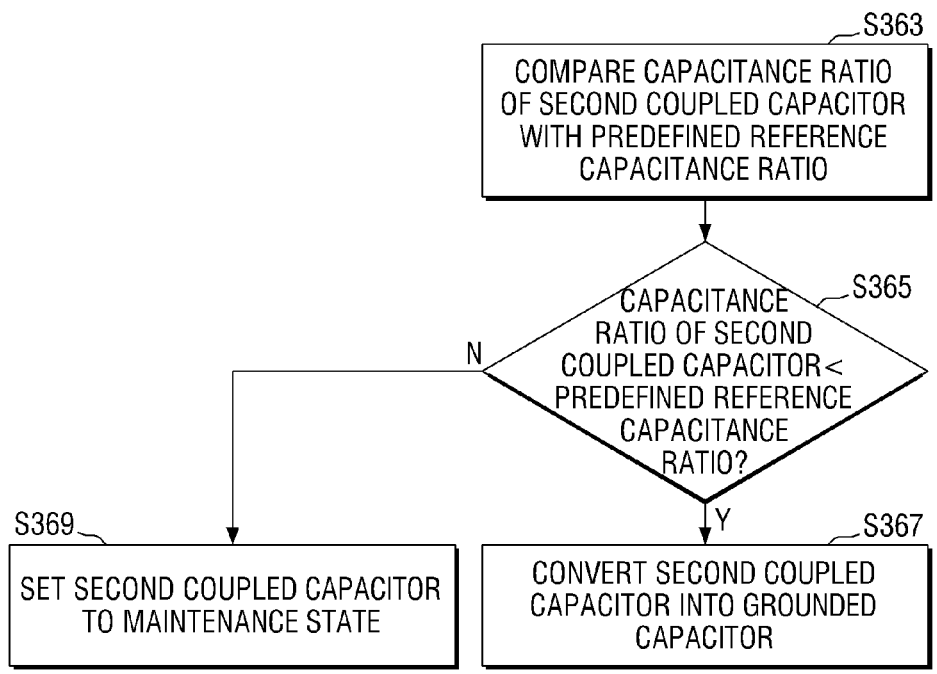
FIG. 13 is a flowchart illustrating another embodiment of step for performing a fourth operation illustrated in FIG. 7 according to an example embodiment.

FIG. 13 is a flowchart illustrating an example of performing the fourth operation illustrated in FIG. 7 according to an example embodiment.

As shown in operation S363, the modeling system 1 compares the capacitance ratio of a second coupled capacitor with a reference capacitance ratio. The reference capacitance ratio may indicate a ratio of coupled capacitance to a sum of capacitances of the group of coupled capacitors and the group of grounded capacitors.

As shown in operation S365, the modeling system 1 determines if the capacitance ratio of the second coupled capacitor is less than the reference capacitance ratio.

If the modeling system 1 determines that the capacitance ratio of the second coupled capacitor is less than the reference capacitance ratio, the modeling system 1 proceeds to operation S367 to convert the second coupled capacitor into a grounded capacitor.

If the modeling system 1 determines that the capacitance ratio of the second coupled capacitor is not less than the reference capacitance ratio, the modeling system 1 proceeds to operation S369 to set the second coupled capacitor to the maintenance state.

Figure 14A:
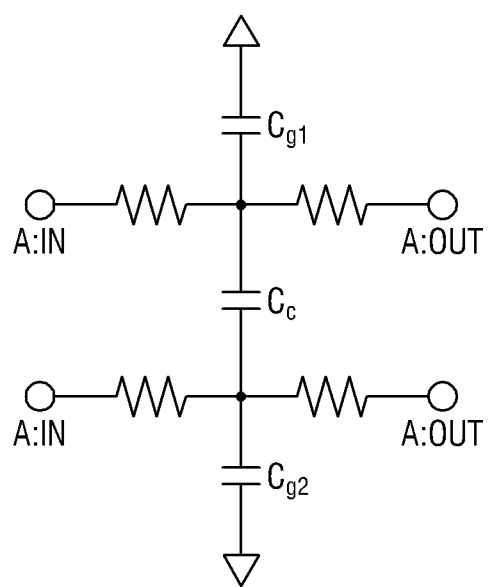

FIGS. 14a and 14b are circuit diagrams for explaining the flowchart illustrated in FIG. 13 according to an example embodiment. FIGS. 14a and 14b illustrate the conversion of a second coupled capacitor $C_c$ having a smaller capacitance ratio than the reference capacitance ratio into grounded capacitors $C_{cg1}$ and $C_{cg2}$.

FIG. 14a illustrates a circuit including the second coupled capacitor $C_c$ and first and second grounded capacitors $C_{g1}$ and $C_{g2}$.

The capacitance ratio of the second coupled capacitor $C_c$ may be calculated by the following equation:

$$\frac{C_c}{C_c + C_{g1} + C_{g2}}.$$

That is, in response to the capacitance ratio of the second coupled capacitor $C_c$ being less than the reference capacitance ratio, the second coupled capacitor $C_c$ may be converted into the grounded capacitors $C_{g1}$ and $C_{g2}$.

A circuit including one second coupled capacitor and two grounded capacitors is depicted in FIG. 14a, but the depicted second coupled capacitor should be construed as being part of larger circuitry, rather than limiting the inventive concepts thereto. Even though the circuit illustrated in FIG. 14a has a different structure from the circuit illustrated in FIG. 12a, the description of the fourth operation of FIG. 13 is the same or similar to the description of the fourth operation with respect to the circuit of FIG. 12a.

Figure 15:
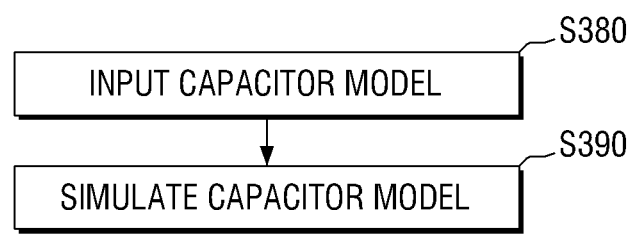
FIG. 15 is a flowchart illustrating a semiconductor device modeling method of the modeling system illustrated in FIG. 4 according to an example embodiment.

FIG. 15 is a flowchart illustrating a semiconductor device modeling method according to an example embodiment. The semiconductor device modeling method of FIG. 15 may be performed by the modeling system 2 depicted by FIGS. 4-6. In some embodiments, the semiconductor device modeling method of FIG. 15 may be performed by any physical computing device that has the same or similar components as modeling system 2 as discussed above with respect to FIG. 4-6.

The semiconductor device modeling method of FIG. 15 may include all of the steps of the semiconductor device modeling method of FIG. 7. For the sake of brevity, only the additional and/or different operations that are not discussed above with respect to the semiconductor device modeling method of FIG. 7 will be discussed.

Referring to FIGS. 4 and 15, the modeling system 2 includes the capacitor model simulation performer 160. As shown in operation S380, the modeling system 2 obtains a capacitor model. In various embodiments, the modeling system 2 may obtain the capacitor model by performing all the steps of the semiconductor device modeling method of FIG. 7 as discussed above.

As shown in operation S390, the modeling system S390 simulates the received capacitor model.

In various embodiments, the capacitor model simulation performer 160 uses the processor 200 to simulate the capacitor model, and thus generates a second output OUTPUT2. A first output OUTPUT1 may include the capacitor model, and the second output OUTPUT2 may include the results of the simulation of the capacitor model.

The processes, functions, methods, and/or software described herein may be recorded, stored, or fixed in one or more computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules that are recorded, stored, or fixed in one or more computer-readable storage media, in order to perform the operations and methods described above, or vice versa. In addition, a computer-readable storage medium may be distributed among computer systems connected through a network and computer-readable codes or program instructions may be stored and executed in a decentralized manner.

Although preferred embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A modeling system, comprising:
a processor including a capacitor model generator configured to generate a capacitor model based on a received circuit configuration,
the capacitor model generator including,
an extract module configured to extract parasitic capacitors from the received circuit configuration; and
a generate module configured to generate the capacitor model by,
classifying the parasitic capacitors into a group of coupled capacitors and a group of grounded capacitors,
classifying the coupled capacitors into first coupled capacitors and second coupled capacitors according to a corresponding influence on a performance of the circuit,
setting the first coupled capacitors to a maintenance state, and
converting at least one of the second coupled capacitors into a grounded capacitor, the at least one of the second coupled capacitors being a second coupled capacitor having a capacitance that is below a desired reference value.

2. The modeling system of claim 1, wherein in determining the corresponding influence of on the performance of the circuit, the generate module is configured to,
convert at least one of the coupled capacitors into a grounded capacitor; and
determine an effective capacitance error based on the converting the coupled capacitor into the grounded capacitor.

3. The modeling system of claim 1, further comprising:
a capacitor model simulation performer configured to,
receive the generated capacitor model from the capacitor model generator, and
simulate the capacitor model.

4. The modeling system of claim 1, wherein,
the generate module includes a first classification sub-model and a second classification sub-module,
the first classification sub-model configured to classify the parasitic capacitors into the group of coupled capacitors and the group of grounded capacitors, and
the second classification sub-module configured to classify the coupled capacitors into the first coupled capacitors and the second coupled capacitors; and
the generate module includes a first processing sub-module and a second processing sub-module,
the first processing sub-module configured to set the first coupled capacitors to the maintenance state, and
the second processing sub-module configured to convert the at least one of the second coupled capacitors into the grounded capacitor;
the first classification sub-module is further configured to provide the classified parasitic capacitors to the second classification sub-module; and
the second classification sub-module is further configured to provide the classified coupled capacitors to the first processing sub-module and the second processing sub-module.

5. The modeling system of claim 4, wherein:
the classified parasitic capacitors include first results to be provided to the first processing sub-module and second results to be provided to the second processing sub-module;
the first results include information relating to the first coupled capacitors; and
the second results include information relating to the second coupled capacitors.

6. The modeling system of claim 5, wherein the information relating to the first coupled capacitors comprises information relating to channel connected components (CCC) coupled capacitors and information relating to Miller coupled capacitors, the Miller coupled capacitors having a greater effective capacitance error than the CCC coupled capacitors.

7. The modeling system of claim 6, wherein:
the second classification sub-module is configured to classify the coupled capacitors into the first coupled capacitors and the second coupled capacitors based on the classified parasitic capacitors received from the classification sub-module,
the second classification sub-module is configured to classify the coupled capacitors into the first coupled capacitors and the second coupled capacitors by,
dividing the group of coupled capacitors into a plurality of CCC units, classifying, as the CCC coupled capacitors, ones from among the group of coupled capacitors having ends that are connected to two nodes included in a same CCC unit of the plurality of CCC units,
classifying, as the Miller coupled capacitors, ones from among the group of coupled capacitors having a first end that is connected to a first CCC unit of the plurality of CCC units and a second end connected to a second CCC unit of the plurality of CCC units,
classifying the Miller coupled capacitors as the first coupled capacitors, and
classifying the remaining ones of the group of coupled capacitors as the second coupled capacitors; and
each of the plurality of CCC units includes a group of transistors electrically connected to one another via a channel.

8. The modeling system of claim 6, wherein:
the first processing sub-module is configured to set the first coupled capacitors to the maintenance state based on the classified parasitic capacitors; and
the setting the first coupled capacitors to the maintenance state includes,
setting the CCC coupled capacitors to the maintenance state, and
setting the Miller coupled capacitors to the maintenance state.

9. The modeling system of claim 5, wherein:
the desired reference value includes at least one of a first reference value based on a desired reference capacitance and a second reference value having a desired reference capacitance ratio; and
the desired reference capacitance ratio is a ratio of the coupled capacitance to a sum of (i) capacitances of the group of coupled capacitors and (ii) capacitances the group of grounded capacitors.

10. The modeling system of claim 9, wherein:
the second processing sub-module is configured to convert the at least one of the second coupled capacitors into the grounded capacitor based on the classified coupled capacitors; and
the converting the at least one of the second coupled capacitors into the grounded capacitor includes
selecting, from among the second coupled capacitors, a second coupled capacitor having a lower capacitance than the first reference value, and
converting the selected second coupled capacitor into the grounded capacitor.

11. The modeling system of claim 9, wherein
the second processing sub-module is configured to convert the at least one of the second coupled capacitors into the grounded capacitor based on the classified coupled capacitors; and
the converting the at least one of the second coupled capacitors into the grounded capacitor includes,
selecting, from among the second coupled capacitors, a second coupled capacitor having a smaller capacitance ratio than the second reference value, and
converting the selected second coupled capacitor into the grounded capacitor.

12. A non-transitory computer-readable recording medium comprising program code for modeling a semiconductor device, the program code, when executed by a processor, configures the processor to:
generate a capacitor model based on a received circuit configuration;
extract parasitic capacitors from a received circuit configuration;
classify the extracted parasitic capacitors into a group of coupled capacitors and a group of grounded capacitors;

classify the group of coupled capacitors into first coupled capacitors and second coupled capacitors according to a corresponding influence on the performance of a circuit;

set the first coupled capacitors to a maintenance state; and convert at least one of the second coupled into a grounded capacitor, the at least one of the second coupled capacitors being a second coupled capacitor having a capacitance that is below a desired reference value.

13. The non-transitory computer-readable recording medium of claim 12, wherein, in determining the corresponding influence of on the performance of the circuit, the processor is configured to:

convert at least one of the coupled capacitors into a grounded capacitor; and determine an effective capacitance error based on the converting the coupled capacitor into the grounded capacitor.

14. The non-transitory computer-readable recording medium of claim 12, wherein the first coupled capacitors include channel connected components (CCC) coupled capacitors and Miller coupled capacitors.

15. The non-transitory computer-readable recording medium of claim 13, wherein, in classifying the group of coupled capacitors into the first coupled capacitors and the second coupled capacitors, the processor is configured to:

divide the group of coupled capacitors into a plurality of CCC units;

classify, as the CCC coupled capacitors, ones from among the group of coupled capacitors having ends connected to two nodes included in same CCC unit;

classify, as the Miller coupled capacitors, ones from among the group of coupled capacitors having a first end that is connected to a first CCC unit of the plurality of CCC units and a second end connected to a second CCC unit of the plurality of CCC units;

classify the Miller coupled capacitors as the first coupled capacitors; and classify the remaining ones of the group of coupled capacitors as the second coupled capacitors; and classify the rest of the coupled capacitors as the second coupled capacitors, and each of the plurality of CCC units includes a group of transistors electrically connected to one another via a channel.

16. The non-transitory computer-readable recording medium of claim 14, wherein, in setting the first coupled capacitors to the maintenance state, the processor is configured to:

set the CCC coupled capacitors to the maintenance state, and set the Miller coupled capacitors to the maintenance state.

17. The non-transitory computer-readable recording medium of claim 12, wherein the desired reference value includes a first reference value having a desired reference capacitance or a second reference having a desired reference capacitance ratio; and the desired reference capacitance ratio includes a ratio of coupled capacitance to a sum of capacitances of the group of coupled capacitors and the group of grounded capacitors.

18. A modeling system for generating a capacitor model, the system including a processor configured to:

receive a circuit configuration;

extract parasitic capacitors from the received circuit configuration;

classify the parasitic capacitors into a group of coupled capacitors and a group of grounded capacitors;

classify the coupled capacitors into first coupled capacitors and second coupled capacitors according to a corresponding influence on a performance of the circuit;

set the first coupled capacitors to a maintenance state;

convert at least one of the second coupled capacitors into a grounded capacitor, the at least one of the second coupled capacitors being a second coupled capacitor having a capacitance that is below a desired reference value; and generate the capacitor model based on the first coupled capacitors and the converted second coupled capacitor.

19. The modeling system of claim 18, wherein, in determining the corresponding influence of on the performance of the circuit, the processor is further configured to:

convert at least one of the coupled capacitors into a grounded capacitor; and determine an effective capacitance error based on the converting the coupled capacitor into the grounded capacitor.

20. The modeling system of claim 18, wherein the processor is further configured to:

simulate the generated capacitor model, the simulating including one of generating a graphic representation generated of the capacitor model and generating an animation of the capacitor model.

* * * * *